(12) United States Patent
Leroy et al.

(10) Patent No.: US 12,092,488 B2
(45) Date of Patent: Sep. 17, 2024

(54) DIAGNOSTIC DEVICE FOR A SENSOR FOR A VEHICLE DRIVE SHAFT

(71) Applicant: Vitesco Technologies GmbH, Regensburg (DE)

(72) Inventors: Yannick Leroy, Toulouse (FR); Thierry Bavois, Toulouse (FR)

(73) Assignee: Vitesco Technologies Gmbh, Regensburg (DE)

( * ) Notice: Subject to any disclaimer, the term of this patent is extended or adjusted under 35 U.S.C. 154(b) by 0 days.

(21) Appl. No.: 18/285,762

(22) PCT Filed: May 23, 2022

(86) PCT No.: PCT/EP2022/063900
§ 371 (c)(1),
(2) Date: Oct. 5, 2023

(87) PCT Pub. No.: WO2022/253614
PCT Pub. Date: Dec. 8, 2022

(65) Prior Publication Data
US 2024/0219205 A1    Jul. 4, 2024

(30) Foreign Application Priority Data
May 31, 2021   (FR) ...................................... 2105670

(51) Int. Cl.
*F02D 41/00*    (2006.01)
*F02D 41/22*    (2006.01)
(Continued)

(52) U.S. Cl.
CPC .............. *G01D 3/08* (2013.01); *F02D 41/009* (2013.01); *F02D 41/222* (2013.01); *G01R 31/007* (2013.01); *G01R 31/2829* (2013.01)

(58) Field of Classification Search
CPC ........ G01D 3/08; F02D 41/009; F02D 41/222; G01R 31/006; G01R 31/2829
(Continued)

(56) References Cited

U.S. PATENT DOCUMENTS

| 7,532,010 B2 | 5/2009 | Kamel et al. |
| 11,530,935 B2 * | 12/2022 | Larue ................... G07C 5/0808 |
| 2016/0161304 A1 * | 6/2016 | Son .......................... G01D 3/08 |
| | | 324/207.12 |

FOREIGN PATENT DOCUMENTS

| CA | 2943275 C * | 10/2020 | ......... E21B 43/2607 |
| CN | 104090234 A * | 10/2014 | |

(Continued)

OTHER PUBLICATIONS

International Search Report and Written Opinion for International Application No. PCT/EP2022/063900, mailed Sep. 12, 2022, 15 pages.

(Continued)

*Primary Examiner* — Jeffrey P Aiello
(74) *Attorney, Agent, or Firm* — Buchanan Ingersoll & Rooney PC

(57) ABSTRACT

A diagnostic device for a sensor for measuring the position of a motor-vehicle drive shaft. The sensor includes a first wired communication link and a second wired communication link, via which wired communication links the sensor sends the signal, and being characterized by an average reference voltage. The diagnostic device for a sensor being intended to be electrically connected between the first wired communication link and the second wired communication link and being configured to: a) receive a first voltage value corresponding to the average voltage in the first wired communication link and a second voltage value corresponding to the average voltage in the second wired communica- (Continued)

tion link; b) detect a short circuit on the first wired communication link; or c) detect a short circuit on the second wired communication link.

9 Claims, 1 Drawing Sheet

(51) Int. Cl.
*G01D 3/08* (2006.01)
*G01R 31/00* (2006.01)
*G01R 31/28* (2006.01)

(58) Field of Classification Search
USPC .... 73/660, 114.61, 1.37, 593; 324/509, 160; 701/31.1, 114, 31.4, 33.9; 702/116, 183, 702/188, 34, 58, 182, 184, 185, 64, 56, 702/60, 33, 104, 117, 42, 1, 94, 85, 127, 702/96, 113, 189, 65, 57, 7, 8
See application file for complete search history.

(56) References Cited

FOREIGN PATENT DOCUMENTS

| | | | | |
|---|---|---|---|---|
| DE | 102015221421 A1 | * | 6/2016 | ............. G01D 18/00 |
| EP | 1903322 A2 | | 3/2008 | |
| FR | 3072166 A1 | | 4/2019 | |
| GB | 2608552 A | * | 1/2023 | ............. B63H 21/17 |
| KR | 101807302 B1 | | 12/2017 | |
| KR | 20180102837 A | | 9/2018 | |

OTHER PUBLICATIONS

International Search Report and Written Opinion for International Application No. PCT/EP2022/063900, mailed Sep. 12, 2022, 13 pages (French).

English Translation of the Written Opinion for International Application No. PCT/EP2022/063900, mailed Sep. 12, 2022, 5 pages.

* cited by examiner ize: 13px"># DIAGNOSTIC DEVICE FOR A SENSOR FOR A VEHICLE DRIVE SHAFT

CROSS REFERENCE TO RELATED APPLICATIONS

This application is the U.S. National Phase Application of PCT International Application No. PCT/EP2022/063900, filed May 23, 2022, which claims priority to French Patent Application No. 2105670, filed May 31, 2021, the contents of such applications being incorporated by reference herein.

FIELD OF THE INVENTION

The invention relates to the field of vehicles, in particular motor vehicles, and more specifically to a diagnostic device for a sensor for a vehicle drive shaft.

BACKGROUND OF THE INVENTION

As is known, a combustion engine of a motor vehicle comprises hollow cylinders that each delimit a combustion chamber into which a mixture of air and fuel is injected. This mixture is compressed in the cylinder by a piston and ignited so as to make the piston translate inside the cylinder. The movement of the pistons in each cylinder of the engine rotates an engine shaft, called "crankshaft", allowing, via a transmission system, the wheels of the vehicle to rotate.

The air is injected into the combustion chamber via one or more intake valves that are regularly opened and closed. Similarly, the gases originating from the compression of the mixture of air and fuel are discharged via one or more exhaust valves. These valves are connected to one or more camshafts allowing them to be successively opened and closed. The crankshaft and the camshafts are in particular mechanically connected by a timing belt or timing chain.

In order to optimize the operation of the combustion engine, and in particular in order to determine the right time to compress the mixture of air and fuel in each cylinder, the combustion engine needs to be phased.

Specifically, during an engine cycle, the crankshaft rotates twice, whereas the camshaft rotates only once. Thus, it is necessary to know whether the crankshaft is in the first rotation or in the second rotation in the engine cycle in order to inject the fuel at the right time and into the right cylinders, this step being called synchronization of the engine.

To do this, a crankshaft sensor and a camshaft sensor are installed in the vehicle in order to measure the angular position of the crankshaft and the angular position of the camshaft, respectively.

To this end, each sensor is installed facing a toothed target fixed to the shaft and measures the changes in the magnetic field which are generated by the teeth passing in front of the sensor. The sensor thus generates a signal of sinusoidal type that it sends to an engine control computer able to analyze the generated signal so as to determine the angular position of the shaft. The sensor comprises two wired connection links via which the sensor is able to send the generated signal.

Furthermore, in order to detect a short circuit between a wired connection link of the sensor and a ground of the vehicle or between a wired connection link and a supply terminal of the vehicle, in particular able to supply power to the components of the engine control computer, an on-board diagnostic device is connected to one of the two wired connection links of the sensor. The diagnostic device is in particular known to a person skilled in the art by the abbreviation "OBD" which stands for "On Board Diagnostic".

The diagnostic device in particular measures the average voltage on the wired communication link to which it is connected. When the average voltage measured is greater than a predefined upper threshold, in particular greater than 3 V, the diagnostic device detects that there is a short circuit between one of the wired links and a supply terminal of the vehicle.

When the average voltage measured is less than a predefined lower threshold, in particular less than 1.3 V, the diagnostic device detects that there is a short circuit between one of the wired links and a ground.

However, the diagnostic device is not able to determine on which connection terminal the short circuit is located. Furthermore, the diagnostic device is only able to detect large variations in voltage. Specifically, the average voltage measured has to necessarily exceed the upper threshold or be strictly less than the lower threshold in order for the diagnostic device to detect a short-circuit fault. However, there may be a fault without the average voltage becoming strictly greater than the upper threshold or strictly less than the lower threshold. This is in particular the case during leakage of current to ground or to the battery, which is not detectable by comparing the measured voltage with the upper and lower thresholds. This type of fault may thus cause the sensor to malfunction.

Therefore, there is a need for a solution that makes it possible to overcome these drawbacks at least in part.

SUMMARY OF THE INVENTION

To this end, an aspect of the invention relates to a diagnostic device for a sensor for measuring the position of a motor-vehicle drive shaft, said sensor being intended to be placed facing the drive shaft and to generate a signal relating to the position of the drive shaft, the sensor comprising a first wired communication link and a second wired communication link, via which wired communication links the sensor sends the signal, and being characterized by an average reference voltage, said switching diagnostic device being intended to be electrically connected between the first wired communication link and the second wired communication link and being configured to:
  a. receive a first voltage value corresponding to the average voltage in the first wired communication link and a second voltage value corresponding to the average voltage in the second wired communication link,
  b. if the absolute value of the difference between the first value and the second value is greater than a predefined tolerance threshold and:
    i. if the absolute value of the difference between the first value and the value of the average reference voltage is greater than the absolute value of the difference between the second value and the value of the average reference voltage, detect a short circuit on the first wired communication link,
    ii. if the absolute value of the difference between the first value and the value of the average reference voltage is less than the absolute value of the difference between the second value and the value of the average reference voltage, detect a short circuit on the second wired communication link.

The diagnostic device thus makes it possible to determine on which wired communication link a short circuit or a current leakage has occurred. In particular, this makes it possible to determine the origin of the fault and thus, if need be, to inform the user or users of the vehicle of the type of fault and of the location of the fault, or to activate a degraded mode of the vehicle in which the engine speed of the vehicle is limited but nevertheless allows the users of the vehicle to return home or to drive to an automotive professional in order to eliminate the fault.

Preferably, the vehicle comprises at least one supply terminal able to supply a constant positive supply voltage and at least one ground, the diagnostic device being configured to:
  a. if the short circuit is detected on the first wired communication link:
    i. detect a short circuit between the first wired communication link and a supply terminal of the vehicle if the first value is greater than the value of the average reference voltage,
    ii. detect a short circuit between the first wired communication link and a ground of the vehicle if the first value is less than the value of the average reference voltage,
  b. if the short circuit is detected on the second wired communication link:
    i. detect a short circuit between the second wired communication link and a supply terminal of the vehicle if the second value is greater than the value of the average reference voltage,
    ii. detect a short circuit between the second wired communication link and a ground of the vehicle if the second value is less than the value of the average reference voltage.

The diagnostic device thus makes it possible to determine the nature of the short circuit or of the current leakage which has occurred. In particular, this makes it possible to determine the origin of the fault and thus, if need be, to inform the user or users of the vehicle of the type of fault and of the location of the fault, or to activate the degraded mode of the vehicle allowing the users of the vehicle to return home or to drive to an automotive professional in order to eliminate the fault.

An aspect of the invention also relates to a vehicle comprising:
  a. a drive shaft,
  b. a sensor intended to be placed facing said drive shaft and to generate a signal relating to the position of the drive shaft, the sensor comprising a first wired communication link and a second wired communication link, via which wired communication links the sensor sends the signal, and being characterized by an average reference voltage,
  c. a diagnostic device as presented above.

More preferably, the vehicle comprises a conversion module connected between the first wired link and the second wired link and configured to convert the analog signal generated by the sensor into a digital signal, the average reference voltage being defined by the conversion module. The digital signal generated by the conversion module makes it possible to determine the angular position of the drive shaft. Furthermore, the average reference voltage makes it possible to define the operating voltage range of the sensor such that said range corresponds to the voltage range of the conversion module.

An aspect of the invention also relates to a method for detecting a short circuit, implemented by a diagnostic device as presented above, the method being noteworthy in that it comprises the steps of:

a. receiving a first voltage value corresponding to the average voltage in the first wired communication link and a second voltage value corresponding to the average voltage in the second wired communication link,
  b. detecting a short circuit on the first wired communication link if:
    i. the absolute value of the difference between the first value and the second value is greater than a predefined tolerance threshold and
    ii. the absolute value of the difference between the first value and the value of the average reference voltage is greater than the absolute value of the difference between the second value and the value of the average reference voltage,
  c. detecting a short circuit on the second wired communication link if:
    i. the absolute value of the difference between the first value and the second value is greater than the predefined tolerance threshold and
    ii. the absolute value of the difference between the first value and the value of the average reference voltage is less than the absolute value of the difference between the second value and the value of the average reference voltage, detect a short circuit on the second wired communication link.

The method thus makes it possible to determine on which wired communication link a short circuit or a current leakage has occurred. In particular, this makes it possible to know the origin of the fault and thus, if need be, to inform the user or users of the vehicle of the type of fault and of the location of the fault, or to activate the degraded mode of the vehicle making it possible for the users of the vehicle to return home or to drive to an automotive professional in order to eliminate the fault.

Preferably, the method comprises the steps of:
  a. if the short circuit is detected on the first wired communication link:
    i. detecting a short circuit between the first wired communication link and a supply terminal of the vehicle if the first value is greater than the value of the average reference voltage,
    ii. detecting a short circuit between the first wired communication link and a ground of the vehicle if the first value is less than the value of the average reference voltage,
  b. if the short circuit is detected on the second wired communication link:
    i. detecting a short circuit between the second wired communication link and a supply terminal of the vehicle if the second value is greater than the value of the average reference voltage,
    ii. detecting a short circuit between the second wired communication link and a ground of the vehicle if the second value is less than the value of the average reference voltage.

The method thus makes it possible to determine the nature of the short circuit or of the current leakage which has occurred. In particular, this makes it possible to know the origin of the fault and thus, if need be, to inform the user or users of the vehicle of the type of fault and of the location of the fault, or to activate the degraded mode of the vehicle making it possible for the users of the vehicle to return home or to drive to an automotive professional in order to eliminate the fault.

An aspect of the invention also relates to a computer program product, characterized in that it comprises a set of program code instructions that, when executed by one or more processors, configure the one or more processors to implement a method as presented above.

BRIEF DESCRIPTION OF THE DRAWINGS

Other features and advantages of aspects of the invention will become more apparent upon reading the following description. This description is purely illustrative and should be read with reference to the appended drawings, in which.

DETAILED DESCRIPTION OF THE PREFERRED EMBODIMENTS

Figure 1:
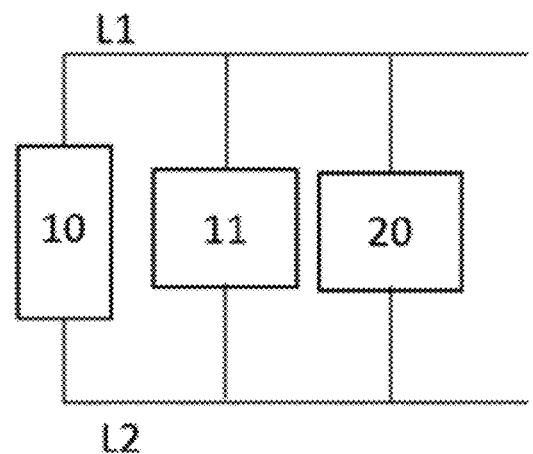
FIG. 1 is an illustration of the sensor and of the diagnostic device according to an aspect of the invention.

An aspect of the invention will be presented in view of implementation in a motor vehicle comprising a combustion engine. However, any implementation in a different context, in particular for any vehicle comprising a drive shaft, is also covered by an aspect of the present invention.

The vehicle therefore comprises a combustion engine. As is known, the combustion engine comprises a plurality of cylinders, a crankshaft and at least one camshaft.

In this non-limiting example, the combustion engine comprises a row of cylinders which is connected to a camshaft and to the crankshaft. However, in another embodiment, the combustion engine could comprise more than one row of cylinders, each row of cylinders being linked to a different camshaft and the plurality of rows of cylinders being connected to a single crankshaft.

The row of cylinders comprises a plurality of cylinders that each delimit a combustion chamber in which a piston slides, the movement of which piston is driven by compression and expansion of the gases resulting from the compression of a mixture of air and fuel introduced into the combustion chambers.

The air and the gases are introduced and expelled from the combustion chamber, respectively, via intake valves and exhaust valves connected to the camshaft of the row of cylinders.

More specifically, the rotating camshaft allows the intake valves and the exhaust valves of each combustion chamber to be alternately opened and closed.

Each cylinder is connected to the crankshaft via its piston. Even more specifically, each piston is connected to the crankshaft by a connecting rod. The crankshaft is therefore set in rotation by the thrust of each piston which allows energy to be transferred by a flywheel (not shown), driving the rotation of the wheels of the vehicle.

During one cycle of the combustion engine, the crankshaft rotates twice, whereas the camshaft rotates only once. In other words, the crankshaft rotates twice as much as the camshaft.

In order to determine the angular position of the crankshaft, the crankshaft comprises a toothed wheel, commonly called "crankshaft target" by a person skilled in the art. The toothed wheel is in particular fixed to an end of the crankshaft. The toothed wheel comprises, for example, a predetermined number of evenly-spaced teeth and a free space, or an additional tooth, which serves as a reference for the angular position.

A measuring sensor 10 is installed facing the toothed wheel of the crankshaft so as to allow the detection of the teeth of the toothed wheel passing in front of said crankshaft sensor 10 when the crankshaft is rotating.

In another embodiment of the invention, the camshaft also comprises a toothed wheel that comprises, for example, a predetermined number of, in particular unevenly-spaced, teeth, and a sensor 10 is installed facing the toothed wheel of the camshaft. In order to simplify the description, the case in which only the crankshaft comprises a toothed wheel and in which a sensor 10 is installed facing said toothed wheel will be considered.

The sensor 10 of the crankshaft is in particular able to generate an alternating analog signal, in particular of sinusoidal type, which is a function of the passage of the teeth of the toothed wheel in front of the sensor 10. The generated signal thus relates to the position of the crankshaft.

Preferably, the sensor 10 is an inductive proximity sensor and in particular a variable reluctance sensor. The sensor 10 comprises a coil through which an electric current flows and the voltage generated by the coil varies when a tooth of the toothed wheel passes in front of the sensor 10.

With reference to FIG. 1, the sensor 10 also comprises a first wired communication link L1 and a second wired communication link L2, via which wired communication links the sensor 10 transmits the generated signal.

Furthermore, the vehicle also comprises a conversion module 11 which is connected to the first wired link L1 and to the second wired link L2. The conversion module 11 is characterized by an average reference voltage $V_m$, more commonly known by the designation "common-mode voltage" by those skilled in the art, and by a defined operating voltage range around the average reference voltage $V_m$.

The conversion module 11 is configured to convert the analog signal generated by the sensor 10 into a digital signal.

The conversion module 11 is then able to transmit the converted digital signal to an engine control computer able to determine the position of the drive shaft, here the crankshaft, on the basis of said signal.

The sensor 10 is also characterized by the average reference voltage $V_m$. The value of the average reference voltage $V_m$ is dependent on each sensor 10 and is defined by the conversion module 11.

The sensor 10 is said to be "floating" since it is not connected to ground. It is therefore necessary to define an operating voltage range of the sensor 10. In the present case, the sensor 10 is polarized around the average reference voltage $V_m$ in order to ensure the sensor 10 operates within the voltage range of the conversion module 11. In particular, the average reference voltage $V_m$ is, for example, a value comprised between 1 V and 2.5 V, and preferably 1.65 V.

The vehicle comprises at least one supply terminal able to supply a constant positive supply voltage in particular in order to supply power to the various components of the engine control computer.

Likewise, the vehicle also comprises at least one ground which is necessary for the engine control computer to operate correctly.

Still with reference to FIG. 1, the vehicle also comprises a diagnostic device 20, in particular known by a person skilled in the art by the abbreviation "OBD" which stands for "On Board Diagnostic".

The diagnostic device 20 is in particular electrically connected to the first wired communication link L1 on one side and to the second wired communication link L2 on the other side.

The diagnostic device 20 comprises a measurement module able to periodically measure a first voltage value V1 corresponding to the average voltage in the first wired communication link L1 and a second voltage value V2 corresponding to the average voltage in the second wired communication link L2.

The diagnostic device 20 is thus configured to receive the first measured voltage value V1 and the second measured voltage value V2.

If the absolute value of the difference between the first value V1 and the second value V2 is greater than a predefined tolerance threshold and if the absolute value of the difference between the first value V1 and the value of the average reference voltage $V_m$ is greater than the absolute value of the difference between the second value V2 and the value of the average reference voltage $V_m$, the diagnostic device 20 is configured to detect a short circuit on the first wired communication link L1.

The predefined tolerance threshold is equal to a voltage value comprised between 0 V and 0.5 V, and preferably 0.1 V.

Moreover, if the absolute value of the difference between the first value V1 and the second value V2 is greater than the predefined tolerance threshold and if the absolute value of the difference between the first value V1 and the value of the average reference voltage $V_m$ is less than the absolute value of the difference between the second value V2 and the value of the average reference voltage $V_m$, the diagnostic device 20 is configured to detect a short circuit on the second wired communication link L2.

In this way, the diagnostic device 20 makes it possible to determine on which wired communication link a short circuit has occurred.

The term "short circuit" here denotes physical contact between a supply terminal of the vehicle or a ground of the vehicle and the first wired link L1 or the second wired link L2, but may also denote leakage of current from the sensor 10 in particular due to an insulation fault of the first wired link L1 or of the second wired link L2.

Furthermore, if the short circuit is detected on the first wired communication link L1, the diagnostic device 20 is able to detect a short circuit between the first wired communication link L1 and a supply terminal of the vehicle if the first value V1 is greater than the value of the average reference voltage $V_m$.

In the present case, this means that there is a fault and that the first wired communication link L1 has entered into physical contact with a supply terminal of the vehicle or with an electrical wire connected to said terminal.

Furthermore, if the short circuit is detected on the first wired communication link L1, the diagnostic device 20 is able to detect a short circuit between the first wired communication link L1 and a ground of the vehicle if the first value V1 is less than the value of the average reference voltage $V_m$.

In the present case, this means that the first wired communication link L1 has entered into physical contact with a ground of the vehicle or with an electrical wire connected to said ground.

The same is true regarding the detection of a short circuit on the second wired communication link L2. The diagnostic device 20 is able to detect a short circuit between the second wired communication link L2 and a supply terminal of the vehicle if the second value V2 is greater than the value of the average reference voltage $V_m$. In the present case, the second wired communication link L2 has entered into physical contact with a supply terminal of the vehicle or with an electrical wire connected to said terminal.

Conversely, the diagnostic device 20 is also able to detect a short circuit between the second wired communication link L2 and a ground of the vehicle if the second value V2 is less than the value of the average reference voltage $V_m$. In the present case, this means that the second wired communication link L2 has entered into physical contact with a ground of the vehicle or with an electrical wire connected to said ground.

The diagnostic device 20 therefore also makes it possible to determine which type of short circuit has occurred on the first wired communication link L1 or the second wired communication link L2.

The diagnostic device 20 is in particular a computer or a microcontroller and comprises a processor able to implement a set of instructions making it possible to carry out these functions.

The diagnostic device 20 may be analog and comprise a combination of amplifiers and comparators for comparing the various voltage values and an electronic sequencer for implementing the functions described above or logic gates.

The diagnostic device 20 may also be digital and comprise an analog-to-digital converter and a module for processing the average voltage values.

Figure 2:
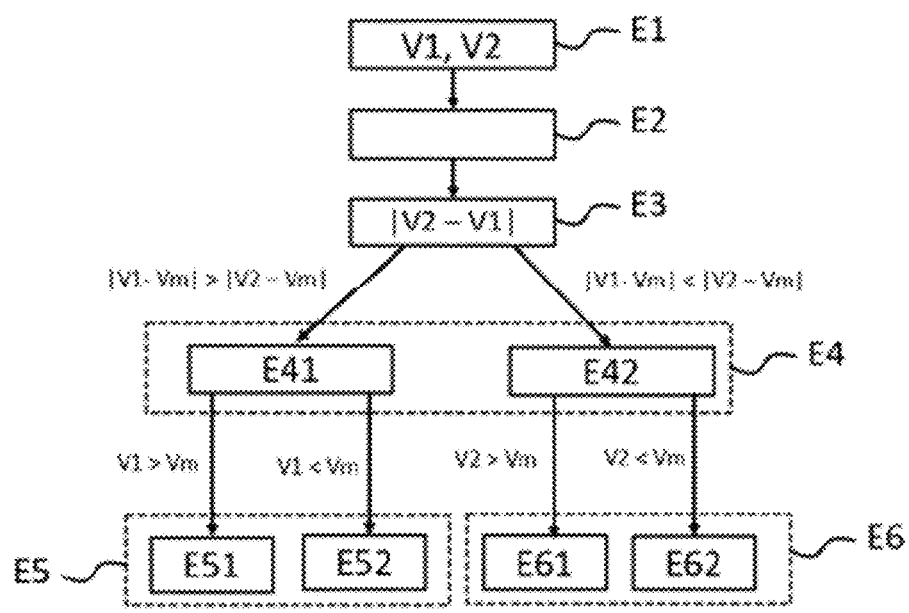
FIG. 2 is a schematic representation of the method according to an aspect of the invention.

With reference to FIG. 2, one embodiment of the method according to the invention will now be described. The method is implemented by the diagnostic device 20 as presented above.

The method firstly comprises a step E1 of periodically measuring the first voltage value V1 corresponding to the average voltage in the first wired communication link L1 and the second voltage value V2 corresponding to the average voltage in the second wired communication link L2.

The method then comprises a step E2 of receiving the first value V1 and the second value V2 by way of the diagnostic device 20.

For each combination of a first voltage value V1 and a second voltage value V2, the method comprises a comparison step E3.

When the absolute value of the difference between the first value V1 and the second value V2 is greater than the predefined tolerance threshold, this means that a short circuit has occurred on the first wired link L1 or the second wired link L2.

The method then comprises a step E4 of determining the location of the short circuit E4. The step E4 of determining the location comprises a sub-step E41 of detecting a short circuit on the first wired communication link L1 if the absolute value of the difference between the first value V1 and the value of the average reference voltage $V_m$ is greater than the absolute value of the difference between the second value V2 and the value of the average reference voltage $V_m$.

When a short circuit has been detected on the first wired link L1, the method comprises a step E5 of determining the type of short circuit detected.

The determination step E5 comprises a sub-step E51 of detecting a short circuit between the first wired communication link L1 and a supply terminal of the vehicle if the first value V1 is greater than the value of the average reference voltage $V_m$.

Conversely, the determination step E5 comprises a sub-step E52 of detecting a short circuit between the first wired communication link L1 and a ground of the vehicle if the first value V1 is less than the value of the average reference voltage $V_m$.

Conversely, the step E4 of determining the location comprises a sub-step E42 of detecting a short circuit on the second wired link L2 if the absolute value of the difference between the first value V1 and the value of the average reference voltage $V_m$ is less than the absolute value of the difference between the second value V2 and the value of the average reference voltage $V_m$.

When a short circuit has been detected on the second wired communication link L2, the method comprises a step E6 of determining the type of the short circuit.

The determination step E6 comprises a sub-step E61 of detecting a short circuit between the second wired communication link L2 and a supply terminal of the vehicle if the second value V2 is greater than the value of the average reference voltage $V_m$.

Conversely, the determination step E6 comprises a sub-step E62 of detecting a short circuit between the second wired communication link L2 and a ground of the vehicle if the second value V2 is less than the value of the average reference voltage $V_m$.

The method thus makes it possible to determine the location and the nature of a short circuit on the first wired link L1 and the second wired link L2 of a sensor 10 as described above.

The invention claimed is:

1. A diagnostic device for a sensor for measuring the position of a motor-vehicle drive shaft, said sensor being intended to be placed facing the drive shaft and to generate a signal relating to the position of the drive shaft, the sensor comprising a first wired communication link and a second wired communication link, via which wired communication links the sensor sends the signal, and an average reference voltage, said diagnostic device for a sensor being intended to be electrically connected between the first wired communication link and the second wired communication link and being configured to:
   a) receive a first voltage value corresponding to the average voltage in the first wired communication link and a second voltage value corresponding to the average voltage in the second wired communication link;
   b) if an absolute value of the difference between the first value and the second value is greater than a predefined tolerance threshold and:
   i) if the absolute value of the difference between the first value and the value of the average reference voltage is greater than the absolute value of the difference between the second value and the value of the average reference voltage, detect a short circuit on the first wired communication link,
   ii) if the absolute value of the difference between the first value and the value of the average reference voltage is less than the absolute value of the difference between the second value and the value of the average reference voltage, detect a short circuit on the second wired communication link.

2. The diagnostic device as claimed in claim 1, the vehicle comprising at least one supply terminal able to supply a constant positive supply voltage and at least one ground, the diagnostic device being configured to:
   a) if the short circuit is detected on the first wired communication link:
   i) detect a short circuit between the first wired communication link and a supply terminal of the vehicle if the first value is greater than the value of the average reference voltage,
   ii) detect a short circuit between the first wired communication link and a ground of the vehicle if the first value is less than the value of the average reference voltage;
   b) if the short circuit is detected on the second wired communication link:
   i) detect a short circuit between the second wired communication link and a supply terminal of the vehicle if the second value is greater than the value of the average reference voltage,
   ii) detect a short circuit between the second wired communication link and a ground of the vehicle if the second value is less than the value of the average reference voltage.

3. A vehicle comprising:
   a) a drive shaft,
   b) a sensor intended to be placed facing said drive shaft and to generate a signal relating to the position of the drive shaft, the sensor comprising a first wired communication link and a second wired communication link, via which wired communication links the sensor sends said signal, and an average reference voltage,
   c) a diagnostic device as claimed in claim 1.

4. The vehicle as claimed in claim 3 comprising a conversion module connected between the first wired link and the second wired link and configured to convert an analog signal generated by the sensor into a digital signal, the average reference voltage being defined by the conversion module.

5. A method for detecting a short circuit, implemented by a diagnostic device as claimed in claim 1, the method comprising:
   a) receiving a first voltage value corresponding to the average voltage in the first wired communication link and a second voltage value corresponding to the average voltage in the second wired communication link,
   b) detecting a short circuit on the first wired communication link if:
   i) the absolute value of the difference between the first value and the second value is greater than a predefined tolerance threshold and
   ii) the absolute value of the difference between the first value and the value of the average reference voltage is greater than the absolute value of the difference between the second value and the value of the average reference voltage,
   c) detecting a short circuit on the second wired communication link if:
   i) the absolute value of the difference between the first value and the second value is greater than the predefined tolerance threshold and
   ii) the absolute value of the difference between the first value and the value of the average reference voltage is less than the absolute value of the difference between the second value and the value of the average reference voltage.

6. The method as claimed in claim 5, comprising:
   a) if the short circuit is detected on the first wired communication link:
   i) detecting a short circuit between the first wired communication link and a supply terminal of the vehicle if the first value is greater than the value of the average reference voltage,
   ii) detecting a short circuit between the first wired communication link and a ground of the vehicle if the first value is less than the value of the average reference voltage;
   b) if the short circuit is detected on the second wired communication link:
   i) detecting a short circuit between the second wired communication link and a supply terminal of the vehicle if the second value is greater than the value of the average reference voltage, ii) detecting a short circuit between the second wired communication link and a ground of the vehicle if the second value is less than the value of the average reference voltage.

7. A non-transitory computer program product, comprising a set of program code instructions that, when executed by one or more processors, configure the one or more processors to implement a method as claimed in claim 5.

8. A non-transitory computer program product, comprising a set of program code instructions that, when executed by one or more processors, configure the one or more processors to implement a method as claimed in claim 6.

9. A method for detecting a short circuit, implemented by a diagnostic device as claimed in claim 2, the method comprising:
   a) receiving a first voltage value corresponding to the average voltage in the first wired communication link and a second voltage value corresponding to the average voltage in the second wired communication link;
   b) detecting a short circuit on the first wired communication link if:
      i) the absolute value of the difference between the first value and the second value is greater than a predefined tolerance threshold and
      ii) the absolute value of the difference between the first value and the value of the average reference voltage is greater than the absolute value of the difference between the second value and the value of the average reference voltage;
   c) detecting a short circuit on the second wired communication link if:
      i) the absolute value of the difference between the first value and the second value is greater than the predefined tolerance threshold and
      ii) the absolute value of the difference between the first value and the value of the average reference voltage is less than the absolute value of the difference between the second value and the value of the average reference voltage.

* * * * *